US012772640B2

(12) United States Patent
Kim et al.

(10) Patent No.: US 12,772,640 B2
(45) Date of Patent: Oct. 20, 2026

(54) LIGHT-EMITTING DISPLAY DEVICE INCLUDING OVERHANG STRUCTURE FORMED BY ORGANIC INSULATING FILM PATTERN

(71) Applicant: LG Display Co., Ltd., Seoul (KR)

(72) Inventors: Seong Kwang Kim, Paju-si (KR); Seong Ku Lee, Paju-si (KR); Kang Il Kim, Paju-si (KR); Ki Hyung Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 478 days.

(21) Appl. No.: 18/481,876

(22) Filed: Oct. 5, 2023

(65) Prior Publication Data

US 2024/0222586 A1 Jul. 4, 2024

(30) Foreign Application Priority Data

Dec. 30, 2022 (KR) ........................ 10-2022-0191246

(51) Int. Cl.
*H10H 20/857* (2025.01)
*H10H 20/831* (2025.01)
*H10W 90/00* (2026.01)

(52) U.S. Cl.
CPC ...... *H10H 20/857* (2025.01); *H10H 20/8312* (2025.01); *H10W 90/00* (2026.01)

(58) Field of Classification Search
CPC . H10H 20/857; H10H 20/8312; H10W 90/00; H10K 59/131
See application file for complete search history.

(56) References Cited

U.S. PATENT DOCUMENTS 9,583,734 B2 2/2017 Shim et al.
11,672,137 B2 6/2023 Shim et al.
(Continued)

FOREIGN PATENT DOCUMENTS

CN 109166862 A 1/2019
CN 114784081 A 7/2022
(Continued)

OTHER PUBLICATIONS

Intellectual Property Office of the United Kingdom, Search Report, United Kingdom Patent Application No. GB2314768.9, Mar. 13, 2024, five pages.

*Primary Examiner* — Tracie Y Green
(74) *Attorney, Agent, or Firm* — Fenwick & West LLP

(57) ABSTRACT

Disclosed is a light-emitting display device having a configuration in which an organic insulating film pattern forming an overhang structure on an auxiliary wire is in direct contact with the auxiliary wire and contacts side surfaces of adjacent metal and insulating films via different tapers, so that structural robustness of an island-type structure can be obtained and connection to a cathode can be strengthened. The light-emitting display device includes an auxiliary wire on a substrate, a first insulating layer having a first hole on the auxiliary wire, a first metal layer having a second hole overlapping the first hole on the first insulating layer, a second insulating layer having a third hole overlapping the second hole on the first metal layer, a second metal layer having a fourth hole overlapping the third hole on the second insulating layer, and an organic insulating film pattern filling the first hole to the fourth hole and contacting the auxiliary wire.

14 Claims, 14 Drawing Sheets

(56) References Cited

U.S. PATENT DOCUMENTS

| | | | | |
|---|---|---|---|---|
| 2014/0191202 | A1 | 7/2014 | Shim et al. | |
| 2019/0245160 | A1 | 8/2019 | Yoon et al. | |
| 2020/0227487 | A1* | 7/2020 | Furuie | H10K 59/873 |
| 2020/0365667 | A1 | 11/2020 | Jo et al. | |
| 2021/0028272 | A1* | 1/2021 | Won | H10D 86/451 |
| 2021/0202882 | A1 | 7/2021 | Shim et al. | |
| 2021/0335990 | A1 | 10/2021 | Chen et al. | |
| 2023/0275101 | A1* | 8/2023 | Chien | H10D 86/60 257/72 |
| 2023/0422542 | A1* | 12/2023 | Hu | H10K 59/131 |
| 2024/0088340 | A1* | 3/2024 | Cho | H10H 20/857 |

FOREIGN PATENT DOCUMENTS

| | | | |
|---|---|---|---|
| EP | 3910693 | A1 | 11/2021 |
| KR | 10-1988217 | B1 | 6/2019 |
| KR | 10-2021-0082908 | A | 7/2021 |
| WO | WO 2020/215479 | A1 | 10/2020 |

* cited by examiner

LIGHT-EMITTING DISPLAY DEVICE INCLUDING OVERHANG STRUCTURE FORMED BY ORGANIC INSULATING FILM PATTERN

CROSS-REFERENCE TO RELATED APPLICATIONS

This application claims the benefit of Korean Patent Application No. 10-2022-0191246, filed on Dec. 30, 2022, which is hereby incorporated by reference as if fully set forth herein.

BACKGROUND

Field

The disclosure relates to a display device, and more particularly, to a light-emitting display device that includes an island-type structure having improved surface adhesion to an auxiliary wire to improve reliability of the connection between the auxiliary wire and a cathode without separation of the island-type structure even during repeated cleaning processes.

Discussion of the Related Art

With the advent of the information society, demand for various forms of display devices for displaying images is increasing.

A light-emitting display device that includes a light-emitting element in each pixel does not require a separate light source unit and thus is effective in realizing slimness or flexibility, and has an advantage of excellent color purity.

For example, a light-emitting element may include two different electrodes and a light-emitting layer therebetween, wherein electrons generated from one electrode and holes generated from the other electrode are injected into the light-emitting layer, and the injected electrons and holes recombine to generate excitons. The excitons fall from an excited state to a ground state, thus causing light generation.

In the light-emitting display device, the light-emitting element included in the pixel has a configuration in which one of the two opposing electrodes is provided as a common electrode that is common to all the pixels. As the area increases, luminance non-uniformity may occur due to the difference in resistance between regions in the common electrode resulting from the difference in distance from a power supply. In addition, the resistance of the common electrode increases as the thickness of the common electrode is decreased to improve transparency of the common electrode, thus causing a voltage drop and thus variation or reduction of the current of the light-emitting element.

SUMMARY

Accordingly, the disclosure is directed to a light-emitting display device that substantially obviates one or more problems due to the limitations and disadvantages of the related art.

The light-emitting display device of the disclosure has a configuration in which a cathode serving as a common electrode is connected to an auxiliary wire in an area where intermediate layers adjacent to an island-type structure are spaced apart, so that a uniform voltage can be applied to the entire active area through the cathode and luminance non-uniformity can be prevented.

In addition, the light-emitting display device of the disclosure has a configuration in which an organic insulating film pattern is formed as an island-type structure that induces formation of an overhang structure, and the organic insulating film pattern is formed so as to contact an auxiliary wire, so that it contacts, via multiple tapers, the side surfaces of the metal layers and the insulating layers along with the auxiliary wire disposed on the lower surface and thus adhesiveness can be improved.

The light-emitting display device of the disclosure has a configuration in which the organic insulating film pattern inducing the overhang structure on the auxiliary wire is in direct contact with the auxiliary wire and contacts the side surfaces of the adjacent metal and insulating films via different tapers, so that structural robustness of the island-type structure can be obtained and connection to the cathode can be strengthened.

Additional advantages, objects, and features of the disclosure will be set forth in part in the description which follows and in part will become apparent to those having ordinary skill in the art upon examination of the following, or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a light-emitting display device includes an auxiliary wire on a substrate, a first insulating layer having a first hole on the auxiliary wire, a first metal layer having a second hole overlapping the first hole on the first insulating layer, a second insulating layer having a third hole overlapping the second hole on the first metal layer, a second metal layer having a fourth hole overlapping the third hole on the second insulating layer, and an organic insulating film pattern filling the first to fourth holes and contacting the auxiliary wire.

It is to be understood that both the foregoing general description and the following detailed description of the disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE INVENTION

Figure 1:
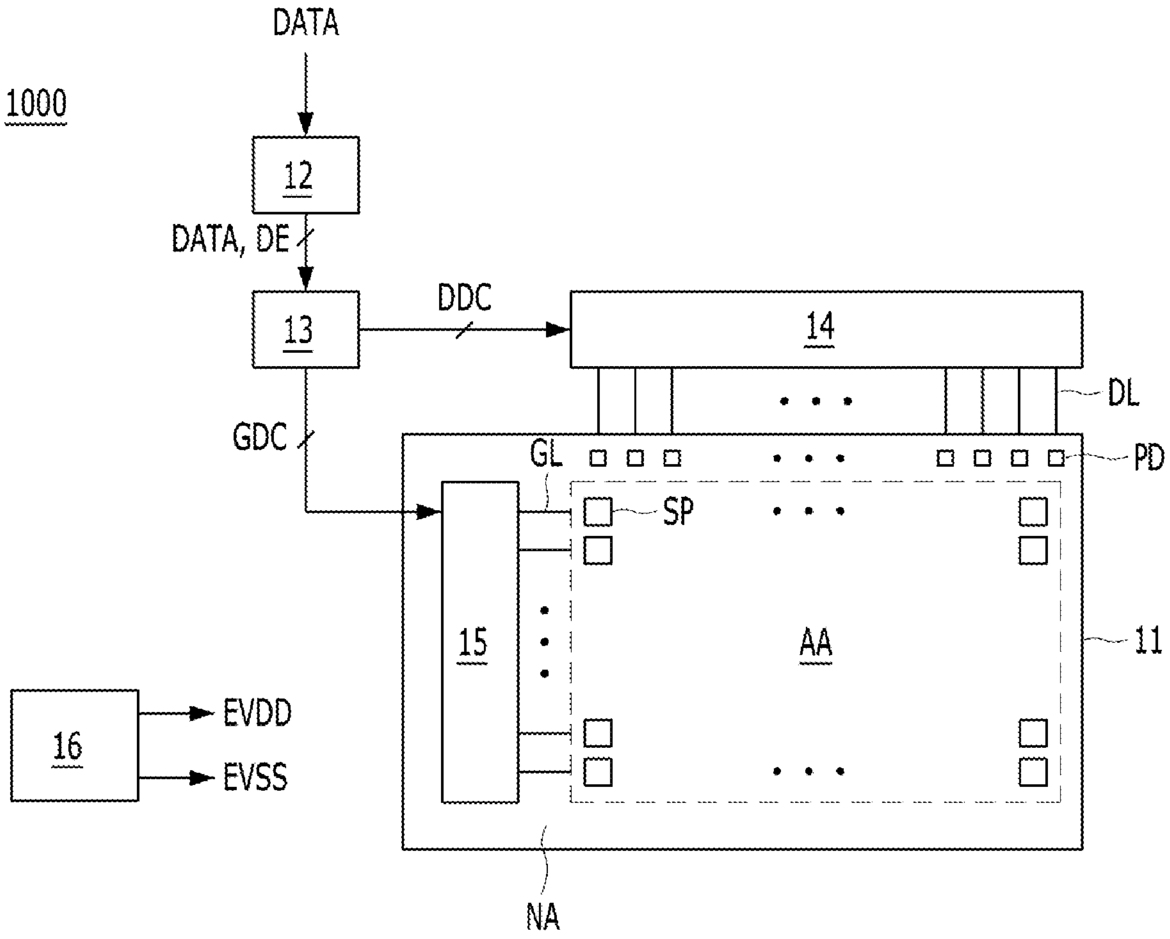
FIG. 1 is a schematic block diagram illustrating a light-emitting display device according to an exemplary embodiment of the disclosure.

Reference will now be made in detail to example embodiments of the present disclosure, examples of which are illustrated in the accompanying drawings. Wherever possible, the same reference numbers will be used throughout the drawings to refer to the same or like parts, unless otherwise specified.

Advantages and features of the present disclosure, and a method of achieving the advantages and features will become apparent with reference to the example embodiments described herein in detail together with the accompanying drawings. The present disclosure should not be construed as limited to the example embodiments as disclosed below, and may be embodied in various different forms. Thus, these example embodiments are set forth only to make the present disclosure sufficiently complete, and to assist those skilled in the art to fully understand the scope of the present disclosure. The protected scope of the present disclosure is defined by the claims and their equivalents.

In the following description of the present disclosure, where the detailed description of the relevant known steps, elements, functions, technologies, and configurations may unnecessarily obscure an important point of the present disclosure, a detailed description of such steps, elements, functions, technologies, and configurations maybe omitted. In addition, the names of elements used in the following description are selected in consideration of clarity of description of the specification, and may differ from the names of elements of actual products. Furthermore, in the following detailed description of the present disclosure, numerous specific details are set forth in order to provide a sufficiently thorough understanding of the present disclosure. However, it will be understood that the present disclosure may be practiced without these specific details. In other instances, known methods, procedures, components, and circuits have not been described in detail so as not to unnecessarily obscure aspects of the present disclosure.

The shapes, sizes, ratios, angles, numbers, and the like, which are illustrated in the drawings to describe various example embodiments of the present disclosure are merely given by way of example. The disclosure is not limited to the illustrations in the drawings.

In the present specification, where terms such as "including," "having," "comprising," and the like are used, one or more components may be added, unless the term, such as "only," is used. As used herein, the term "and/or" includes a single associated listed item and any and all of the combinations of two or more of the associated listed items.

An expression such as "at least one of" when preceding a list of elements may modify the entire list of elements and may not modify the individual elements of the list. The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The terminology used herein is to describe particular aspects and is not intended to limit the present disclosure. As used herein, the terms "a" and "an" used to describe an element in the singular form is intended to include a plurality of elements. An element described in the singular form is intended to include a plurality of elements, and vice versa, unless the context clearly indicates otherwise.

In construing a component or numerical value, the component or the numerical value is to be construed as including an error or tolerance range even where no explicit description of such an error or tolerance range is provided.

In describing the various example embodiments of the present disclosure, where the positional relationship between two elements is described using terms, such as "on", "above", "under" and "next to", at least one intervening element may be present between the two elements, unless "immediate(ly)" or "direct(ly)" or "close(ly) is used. It will be understood that when an element or layer is referred to as being "connected to", or "coupled to" another element or layer, it may be directly connected to or coupled to the other element or layer, or one or more intervening elements or layers may be present.

In describing the various example embodiments of the present disclosure, when terms such as "after," "subsequently," "next," and "before," are used to describe the temporal relationship between two events, another event may occur therebetween, unless a more limiting term, such as "just," "immediate(ly)," or "directly" is used.

In describing the various example embodiments of the present disclosure, terms such as "first" and "second" may be used to describe a variety of components. These terms aim to distinguish the same or similar components from one another and do not limit the components. Accordingly, throughout the specification, a "first" component may be the same as a "second" component within the technical concept of the present disclosure, unless specifically mentioned otherwise.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, a light-emitting display device and a method of manufacturing the same will be described with reference to the annexed drawings.

FIG. 1 is a schematic block diagram illustrating a light-emitting display device according to an exemplary embodiment of the disclosure.

As shown in FIG. 1, a light-emitting display device 1000 according to an exemplary embodiment of the disclosure includes a display panel 11, an image processor 12, a timing controller 13, a data driver 14, a scan driver 15, and a power supply 16.

The display panel 11 may display an image in response to a data signal DATA supplied from the data driver 14, a scan signal supplied from the scan driver 15, and power supplied from the power supply 16.

The display panel 11 may include a sub-pixel SP disposed at each of the intersections of a plurality of gate lines GL and a plurality of data lines DL. The structure of the sub-pixel SP may be varied depending on the type of the light-emitting display device 1000.

For example, the sub-pixels SP may be formed using a top emission method, a bottom emission method, or a dual emission method, depending on the structure. The sub-pixels SP are units capable of emitting light of their own color with or without a specific type of color filter. For example, the sub-pixels SP may include a red sub-pixel, a green sub-pixel, and a blue sub-pixel. Alternatively, the sub-pixels SP may include, for example, a red sub-pixel, a blue sub-pixel, a white sub-pixel, and a green sub-pixel. The sub-pixels SP may have one or more different light-emitting areas depending on light-emitting characteristics. For example, the blue sub-pixel and sub-pixels emitting light of a different color may have different light-emitting areas.

One or more sub-pixels SP may constitute one unit pixel. For example, one unit pixel may include red, green, and blue sub-pixels, and may have a configuration in which the red, green, and blue sub-pixels are repeatedly disposed. Alternatively, one unit pixel may include red, green, blue, and white sub-pixels, and may have a configuration in which the red, green, blue, and white sub-pixels are repeatedly disposed, or the red, green, blue, and white sub-pixels are disposed in the form of quads, for example in a group of four which may be square in shape. In an embodiment according to the present disclosure, the color type, disposition type, and disposition order of sub-pixels may be varied depending on light-emitting characteristics, element lifespan, and device specifications, but are not limited thereto.

The display panel 11 may be divided into an active area AA where sub-pixels SP are disposed to display an image and a non-active area NA around the active area AA. The scan driver 15 may be mounted in the non-active area NA of the display panel 11. In addition, the non-active area NA may include a pad portion PAD including a pad electrode PD.

The image processor 12 may output a data enable signal DE along with the data signal DATA supplied from the outside. The image processer 12 may output at least one of a vertical sync signal, a horizontal sync signal, and a clock signal in addition to the data enable signal DE, although these signals are not shown for convenience of description.

The timing controller 13 may receive the data signal DATA along with the driving signal from the image processor 12. The driving signal may include the data enable signal DE. Alternatively, the driving signal may include a vertical sync signal, a horizontal sync signal, and a clock signal. The timing controller 13 may output a data timing control signal DDC for controlling the operation timing of the data driver 14 and a gate timing control signal GDC for controlling the operation timing of the scan driver 15 based on the driving signal.

The data driver 14 may sample and latch the data signal DATA supplied from the timing controller 13 in response to the data timing control signal DDC supplied from the timing controller 13, may convert the data signal DATA into a gamma reference voltage, and may output the result.

The data driver 14 may output the data signal DATA through the data lines DL. The data driver 14 may be implemented in the form of an integrated circuit IC. For example, the data driver 14 may be electrically connected to a pad electrode PD disposed in the non-active area NA of the display panel 11 through a flexible circuit film (not shown).

The scan driver 15 may output a scan signal in response to the gate timing control signal GDC supplied from the timing controller 13. The scan driver 15 may output scan signals through the gate lines GL. The scan driver 15 may be implemented in the form of an integrated circuit IC or may be implemented in the form of a gate-in-panel GIP in the display panel 11.

The power supply 16 may output a high potential voltage, a low potential voltage or the like for driving the display panel 11. The power supply 16 may supply a high potential voltage to the display panel 11 through a first power line EVDD (driving power line or pixel power line) and may supply a low potential voltage to the display panel 11 through a second power line EVSS (auxiliary power line or a common power line).

The display panel 11 is divided into an active area AA and a non-active area NA, and may include a plurality of sub-pixels SP defined by the gate lines GL and data lines DL that cross each other on the substrate 100 in the active area AA to form a matrix.

The sub-pixels SP may include sub-pixels that emit at least two of red light, green light, blue light, yellow light, magenta light, and cyan light. Also, the sub-pixels SP may emit light of their own colors with or without a specific type of color filter, but the disclosure is not necessarily limited thereto. The color type, disposition type, disposition order, or the like of the sub-pixels SP may be varied depending on light-emitting characteristics, element lifespan, device specifications and the like.

Hereinafter, the structure of each sub-pixel of the active area and the configuration of the pad portion will be described with reference to the drawings.

Figure 2:
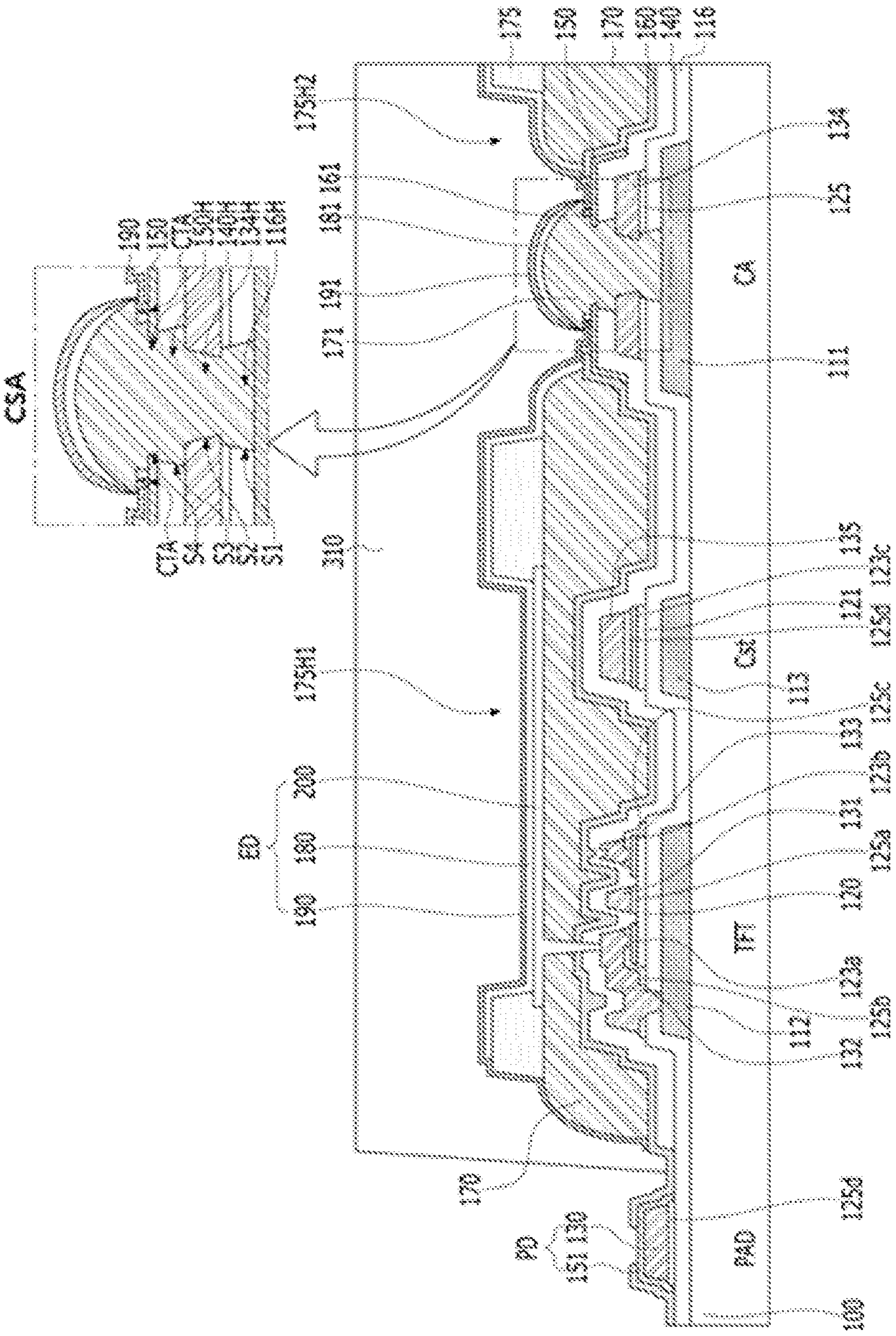
FIG. 2 is a cross-sectional view illustrating a light-emitting display device according to a first embodiment of the disclosure.

FIG. 2 is a cross-sectional view illustrating a light-emitting display device according to a first embodiment of the disclosure.

The cross-sectional view of FIG. 2 shows one sub-pixel including the thin film transistor TFT and the storage capacitor Cst, and a connection area CA adjacent thereto in the active area AA, and the pad portion PAD in the non-active area NA.

The light-emitting display device according to an exemplary embodiment of the present disclosure includes a substrate 100, a light-blocking layer 112, an auxiliary wire 111, a buffer layer 116 (also known as first insulating layer 116 in the present disclosure), a thin film transistor TFT, a storage capacitor Cst, a gate insulating film pattern 125, an interlayer insulating film 140, an inorganic protective layer 160, a planarization film 170, an organic insulating film pattern 171, a light-emitting element ED, a bank layer 175, a connection structure CSA, an encapsulation layer 310 and a pad electrode PD. The connection structure CSA between an auxiliary wire 111 and a cathode 190 is provided at the connection area CA.

The substrate 100 is a base substrate and may be made of glass or plastic. For example, the substrate 100 may be formed of a plastic material such as polyimide (PI), polyethylene terephthalate (PET), polyethylene naphthalate (PEN), or polycarbonate (PC) and thus may be flexible.

Circuit elements including various signal lines, thin film transistors TFTs, storage capacitors Cst, and the like may be each formed on the substrate 100 in a plurality of subpixels. The signal lines include a gate line GL, a data line DL, a first power line EVDD (driving power line or pixel power line), a second power line EVSS (auxiliary power line or common power line), a reference line and the like, and the thin film transistor TFT may include a driving thin film transistor, a switching thin film transistor, a sensing thin film transistor and the like.

The light-blocking layer 112 and the auxiliary wire 111 (a second power line or a common power line) may be disposed on the substrate 100. The light-blocking layer 112 may be disposed to overlap the thin film transistor TFT. For example, the light-blocking layer 112 may overlap a first semiconductor layer 120 of the thin film transistor (TFT), and in particular, may be disposed to overlap a channel region of the first semiconductor layer 120 as would be seen in a plan view. The light-blocking layer 112 may serve to block external light from entering the first semiconductor layer 120. In addition, the auxiliary power line (see EVSS in FIG. 1) may serve to apply a low voltage to the cathode 190 (common electrode or second electrode). In addition, the auxiliary power line may serve to lower the resistance of the cathode 190 along with the auxiliary wire 111 and hence mitigate voltage drop across the display device.

The light-blocking layer 112 and the auxiliary wire 111 may be formed of the same material on the same layer. In this case, the light-blocking layer 112 and the auxiliary wire may be simultaneously formed through the same process.

In addition, the first storage electrode 113 of the storage capacitor Cst may be formed on the same layer as the light-blocking layer 112.

A buffer layer 116 may be disposed on the substrate 100 such that it covers the auxiliary wire 111, the light-blocking layer 112, and the first storage electrode 113. The buffer layer 116 may be formed by stacking a single layer or a plurality of inorganic films. For example, the buffer layer 116 may be formed as a single layer including a silicon oxide film (SiOx), a silicon nitride film (SiNx), or a silicon oxynitride film (SiOxNy). Alternatively, the buffer layer 116 may be a multilayer film in which at least two of a silicon oxide film (SiOx), a silicon nitride film (SiNx), and a silicon oxynitride film (SiOxNy) are stacked. The buffer layer 116 may be formed over the entire upper surface of the substrate 100 in order to prevent ions or impurities from diffusing from the substrate 100 and prevent moisture from penetrating into the light-emitting element ED through the substrate 100.

The thin film transistor TFT on the light-blocking layer 112, a second electrode structure of the storage capacitor Cst, and a gate metal layer 134 (also denoted as first metal layer 134 in the present disclosure) on the buffer layer 116 are provided.

Specifically, the thin film transistor (TFT) includes a first semiconductor layer 120, conductive layers **123*a* and 123*b* provided on top of both sides of the first semiconductor layer 120, a gate electrode 131 overlapping with the channel region of the first semiconductor layer 120 via a gate insulating film 125*a* interposed therebetween, and a source electrode 132 and a drain electrode 133 respectively connected to the conductive layers 123*a* and 123*b*. Any one of the drain electrode 133 and the source electrode 132 may be connected to the anode 200 of the light-emitting element ED. Although the illustrated example shows a state in which the source electrode 132** is connected to the anode of the light-emitting element ED, the disclosure is not limited thereto.

In addition, in the example shown in FIG. 2, a first metal material is used to form the light-blocking layer 112, the first storage electrode 113, and the auxiliary wire 111, and a second metal material is used to form the gate electrode 131, the source electrode 132, the drain electrode 133, the second storage electrode 135, and the gate metal layer 134. FIG. 2 shows an example in which formation of a thin film transistor array and a connection structure is possible through a two-layer metal patterning process. The use of such a two-layer metal may be effective in reducing the number of masks by reducing the number of metals to be patterned. In this case, the first metal may be used to form wires for connection to the gate electrode 131 and the source electrode 132 in the active area AA.

Meanwhile, the light-blocking layer 112 may be further provided in a lower region such that it overlaps underneath the first semiconductor layer 120 of the thin film transistor TFT.

The light-blocking layer 112 is disposed on the same layer as the auxiliary wire 111 and is a metal located in the lowermost region among metals provided on the substrate 100.

One side of the light-blocking layer 112 may be connected to the drain electrode 133 or the source electrode 132. In this case, it is possible to prevent voltage fluctuation of the first semiconductor layer 120 that may be caused by the light-blocking layer in a floating state.

A buffer layer 116 is provided between the light-blocking layer 112 and the first semiconductor layer 120 to maintain insulation between the light-blocking layer 112 and the first semiconductor layer 120.

The first semiconductor layer 120 may include, for example, at least one of an amorphous silicon semiconductor layer, a crystalline silicon semiconductor layer, an oxide semiconductor layer, and a metal-induced semiconductor layer. In some cases, the first semiconductor layer 120 may be formed of a plurality of identical or different types of semiconductor layers.

The storage capacitor Cst includes a first storage electrode 113 disposed on the same layer as the light-blocking layer 112 and a second storage electrode 135 disposed on the same layer as the gate metal layer 134. A buffer layer 116, a second semiconductor layer 121, and a conductive layer **123*c* may be sequentially provided between the first storage electrode 113 and the second storage electrode 135 from the bottom in that order. In this case, the conductive layer 123*c* functions as an additional storage electrode and increases the capacity of the storage capacitor in a given area. The first semiconductor layer 120 and the second semiconductor layer 121** may be considered to be portions of the same semiconductor layer.

For example, when the first semiconductor layer 120 and the second semiconductor layer 121 are made of a transparent oxide, the conductive layers **123*a*, 123*b*, and 123*c* may be formed of a highly conductive transparent oxide compared to the first and second semiconductor layers 120 and 121. In this case, the first semiconductor layer 120 and the conductive layers 123*a* and 123*b* contact each other at the interfaces therebetween and the conductive layers 123*a* and 123*b* may be removed in the channel region. In the storage capacitor Cst, the second semiconductor layer 121 and the conductive layer 123*c*** are in contact with each other at the interface therebetween.

The conductive layers **123*a*, and 123*b*/123*c* may be patterned in the same process using an etchant having different etch selectivity (speed/rate of etching) from the first semiconductor layer 120 and the second semiconductor layer 121** disposed thereunder.

The pad electrode PD includes a pad metal layer 130 on the same layer as the gate metal layer 134 and a pad protection electrode 151 on the same layer as the clad metal 150. In some cases, the pad electrode PD may further include a pad metal of the same layer as the light-blocking layer 112 or may be formed of a pad metal of the same layer as the light-blocking layer 112.

The pad protection electrode 151 is provided to protect the surface of the pad electrode PD during bonding with an external printed circuit film. The pad protection electrode 151 may be formed to completely cover the lower pad metal layer 130. That is, the pad protection electrode 151 is formed to cover the top and side surfaces of the lower pad metal layer 130 and extend to a portion of the surface of the buffer layer 116.

In addition, the interlayer insulating film 140, the inorganic protective layer 160, and the planarization film 170 may be sequentially formed to protect the thin film transistor TFT, the storage capacitor Cst, and the gate metal layer 134. In this context, sequentially means that these layers are stacked one on top of the other in the above order. There may be other layers therebetween.

Meanwhile, the buffer layer 116, the interlayer insulating film 140, and the inorganic protective layer 160 are made of an inorganic insulating material. For example, the buffer layer 116, the interlayer insulating film 140, and the inorganic protective layer 160 are formed of a material such as silicon oxide (SiOx), silicon nitride (SiNx), silicon oxynitride (SiOxNy), or aluminum oxide ($Al_2O_3$). In some cases, an additional buffer layer may be further provided on the buffer layer 116. In this case, the additional buffer layer may be formed of the inorganic insulating material listed above.

The gate insulating film 125*a* may be disposed in the channel region of the first semiconductor layer 120 and may function to insulate the first semiconductor layer 120 from the gate electrode 131. The gate insulating film 125*a*, the source/drain electrodes 132 and 133, the second storage electrode 135, and the gate insulating film patterns 125*b*, 125*c*, 125*d*, and 125*e* (provided under the lower pad metal layer 130) may be formed of an inorganic insulating material, for example, a silicon oxide film (SiOx), a silicon nitride film (SiNx), a silicon oxynitride film (SiOxNy), or a multilayer film thereof.

The gate insulating film 125*a*, the gate insulating film patterns 125*b*, 125*c*, 125*d*, 125*e*, and 125, the interlayer insulating film 140, and the inorganic protective layer 160 are made of a silicon oxide film (SiOx), a silicon nitride film (SiNx), a silicon oxynitride film (SiOxNy), or an aluminum oxide film ($Al_2O_3$), similar to the material listed for the buffer layer 116.

In addition, the planarization film 170 is provided to provide planarization and is made of at least one of organic materials such as photoacryl, polyimide, benzocyclobutene, and acrylate resins. The planarization film 170 has a thickness of about 1 μm to about 5 μm. In some cases, the planarization film 170 may be divided into a plurality of parts.

The auxiliary wire 111 and the gate metal layer 134 may be formed of a single layer or multiple layers including any one selected from the group consisting of copper (Cu), molybdenum (Mo), aluminum (Al), chromium (Cr), gold (Au), titanium (Ti), nickel (Ni), neodymium (Nd), tantalum (Ta), and tungsten (W), or an alloy thereof.

For example, when the auxiliary wire 111 and the gate metal layer 134 are a single layer, they may be formed of a single layer or multiple layers including any one selected from the group consisting of molybdenum (Mo), aluminum (Al), chromium (Cr), gold (Au), titanium (Ti), nickel (Ni), neodymium (Nd) and copper (Cu), or an alloy thereof. In addition, the auxiliary wire 111 and the gate metal layer 134 may be formed of a double layer such as molybdenum/aluminum-neodymium (Mo/Al—Nd), molybdenum/aluminum (Mo/Al), titanium/aluminum (Ti/Al), or copper/molybdenum-titanium (Cu/MoTi). Alternatively, the auxiliary wire 111 and the gate metal layer 134 may be formed of a triple layer such as molybdenum/aluminum-neodymium/molybdenum (Mo/Al—Nd/Mo), molybdenum/aluminum/molybdenum (Mo/Al/Mo), titanium/aluminum/titanium (Ti/Al/Ti), or molybdenum-titanium/copper/molybdenum-titanium (MoTi/Cu/MoTi), but is not limited thereto. The auxiliary wire 111 and the gate metal layer 134 may be a multi-layer including any one selected from the group consisting of molybdenum (Mo), aluminum (Al), chromium (Cr), gold (Au), titanium (Ti), nickel (Ni), neodymium (Nd) and copper (Cu), or an alloy thereof.

The gate metal layer 134 may be formed of the same material on the same layer as the gate electrode 131, the source electrode 132, and the drain electrode 133 of the thin film transistor TFT, and the second storage electrode 135 of the storage capacitor Cst and the lower pad metal layer 130 of the pad electrode PD.

A light-emitting element ED is provided on the planarization layer 170, and the light-emitting element ED includes an anode 200 (also denoted as first electrode 200 in the present disclosure), an intermediate layer 180, and a cathode 190 (also denoted as second electrode 190 in the present disclosure).

The intermediate layer 180 may include, for example, a hole injection layer, a hole transport layer, a light-emitting layer, an electron transport layer, and an electron injection layer. At least one of the layers included in the intermediate layer 180 may be formed over the entire active area AA. For example, at least one of the hole injection layer, the hole transport layer, the electron transport layer, or the electron injection layer may be formed over the entire active area AA.

In some cases, the intermediate layer 180 may include a multi-stack structure in which each stack includes one or more light-emitting layers. In this case, the plurality of stacks may be isolated by a charge generation layer. The charge generation layer may include an n-type charge generation layer and a p-type charge generation layer.

Each of the plurality of stacks may include, for example, a hole transport layer, at least one light-emitting layer, and an electron transport layer. In some cases, the n-type charge generation layer may also function as an electron transport layer of an adjacent stack. The p-type charge generation layer may also function as a hole transport layer of an adjacent stack.

The anode 200 (pixel electrode or first electrode) may be formed of a metal, an alloy thereof, or a combination of a metal and a metal oxide. For example, in a top-emission type, the anode 200 may be formed to have a multilayer structure including a transparent conductive film and an opaque conductive film having high reflective efficiency. The transparent conductive film of the anode 200 is made of a material having a relatively large work function value such as indium tin oxide (ITO) or indium zinc oxide (IZO), and the opaque conductive film thereof is formed of a single layer or multiple layers including any one selected from the group consisting of silver (Ag), aluminum (Al), copper (Cu), molybdenum (Mo), titanium (Ti), nickel (Ni), chromium (Cr), and tungsten (W), or an alloy thereof. For example, the pixel electrode PXL may have a structure in which a transparent conductive film, an opaque conductive film, and a transparent conductive film are sequentially stacked, or a transparent conductive film and an opaque conductive film are sequentially stacked.

The cathode 190 may be made of a transparent conductive material such as indium tin oxide (ITO) or indium zinc oxide (IZO), and may be formed of silver (Ag), aluminum (Al), magnesium (Mg), calcium (Ca), or ytterbium (Yb), which is thin enough to transmit light, or an alloy containing at least one thereof.

The anode 200 is exposed in the first bank hole 175H1 of the bank 175 to define an opening and light is emitted through this portion. In addition, a connection structure between the cathode 190 and the auxiliary wire 111 is formed in the second bank hole 175H2 of the bank 175.

The second bank hole 175H2 is provided in the bank 175 and the auxiliary wire 111 is provided in the second bank hole 175H2.

A buffer layer 116, a gate insulating film pattern 125, a gate metal 134, interlayer insulating film 140 and a clad metal 150 (also denoted as second metal layer 150 in the present disclosure) are provided on the auxiliary wire 111. These may be provided sequentially on the auxiliary wire 111. In addition, each of the buffer layer 116, the gate insulating film pattern 125, the gate metal layer 134, the interlayer insulating film 140 and the clad metal 150 is provided with a hole structure, in which the organic insulating film pattern 171 is embedded, such that the organic insulating film pattern 171 directly contacts the auxiliary wire 111 on the auxiliary wire 111. This will be described later.

The connection structure CSA of the light-emitting display device of the disclosure means a configuration having an organic insulating film pattern 171 in the form of an island for supporting electrical connection between the auxiliary wire 111 and the cathode 190. FIG. 2 illustrates an example in which the organic insulating film pattern 171 is formed along with the planarization film 170. Examples of the disclosure are not limited thereto, which will be described later.

The organic insulating film pattern 171 in the connection structures CSA forms an overhang structure, wherein the cathode 190 is connected to the upper surface of the clad metal 150, without the intermediate layer 180, in a portion vertically spaced from the lower clad metal 150 of the overhang structure. As a result, a cathode-clad connection CTA is provided.

Meanwhile, the organic insulating film pattern 171 is further provided on the upper surface thereof with an intermediate layer dummy pattern 181 separated from the intermediate layer 180 in the region where the overhang structure overlaps with the clad metal 150, and a cathode dummy pattern 191 disposed on the intermediate layer dummy pattern 181.

An encapsulation layer 310 may be applied on the light-emitting element ED and the organic insulating film pattern 171 to protect the light-emitting element ED.

In one embodiment, the encapsulation layer 310 may be formed of an inorganic single layer. For example, the encapsulation layer EPAS may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride or the like. In another embodiment, the encapsulation layer EPAS may be a multi-layer of an inorganic layer/organic layer/inorganic layer. In this case, the inorganic layer may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride or the like, as described above, and the organic layer may be formed of an acrylic resin, a methacrylic resin, polyisoprene, a vinyl resin, an epoxy resin, a urethane resin, a cellulose resin, a pherylene resin or the like.

However, the structure of the encapsulation layer EPAS is not limited to the above-described example, and the stack structure of the encapsulation layer 310 may be varied.

Figure 3:
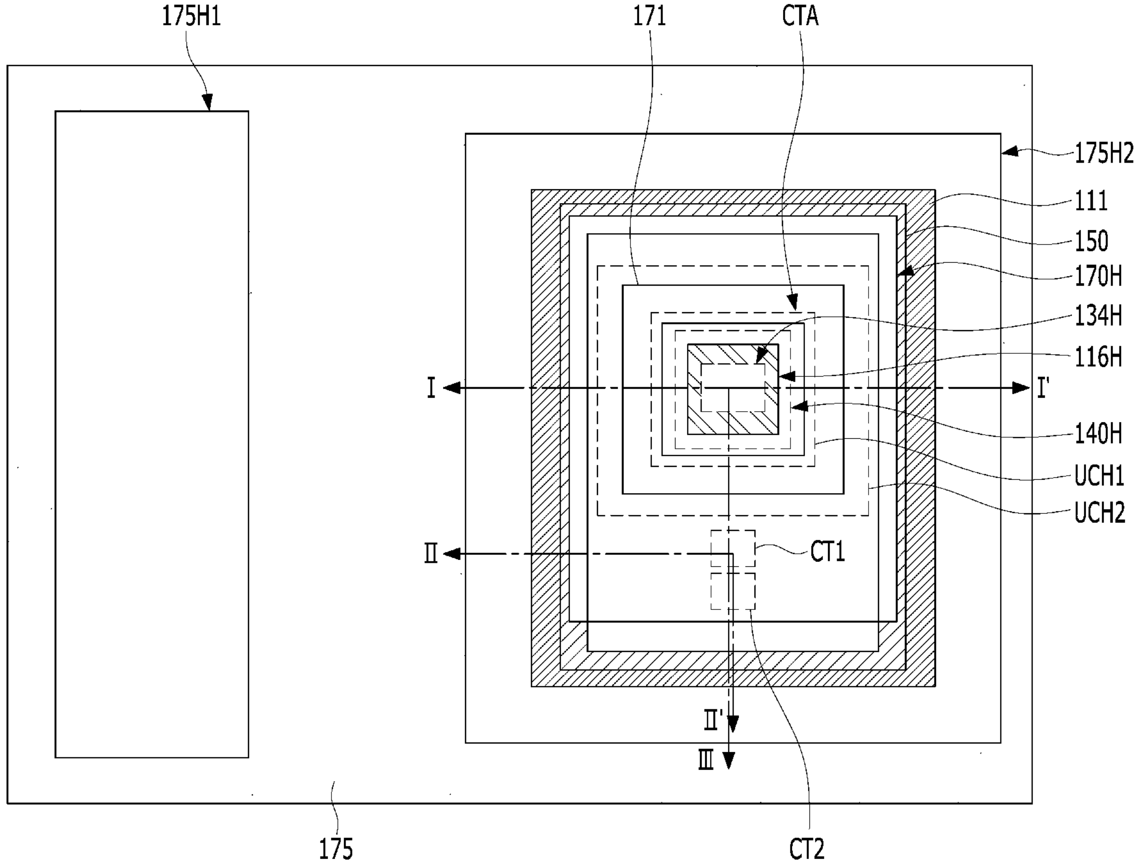
FIG. 3 is a plan view illustrating first and second bank holes adjacent to each other in the active area of FIG. 2 and an internal configuration thereof.
Figure 4:
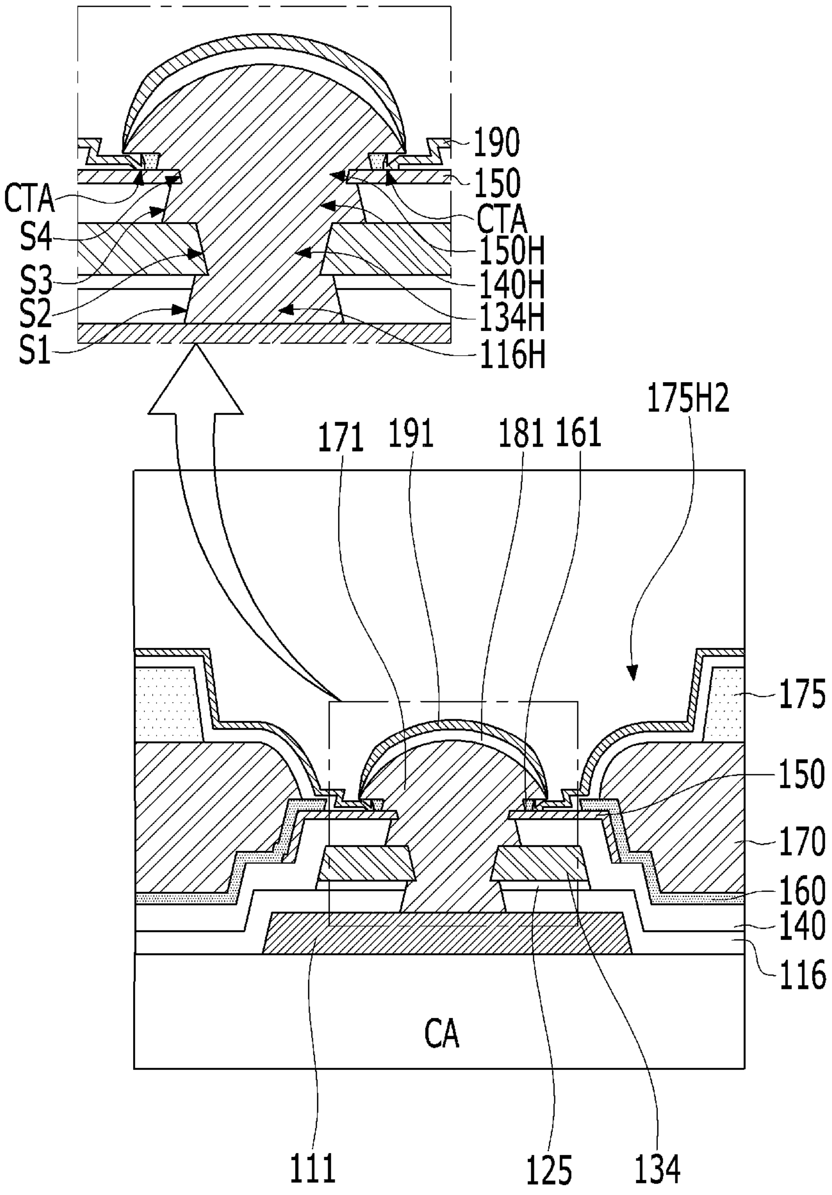
FIG. 4 is a cross-sectional view taken along line I-I' of FIG. 3.
Figure 5A:
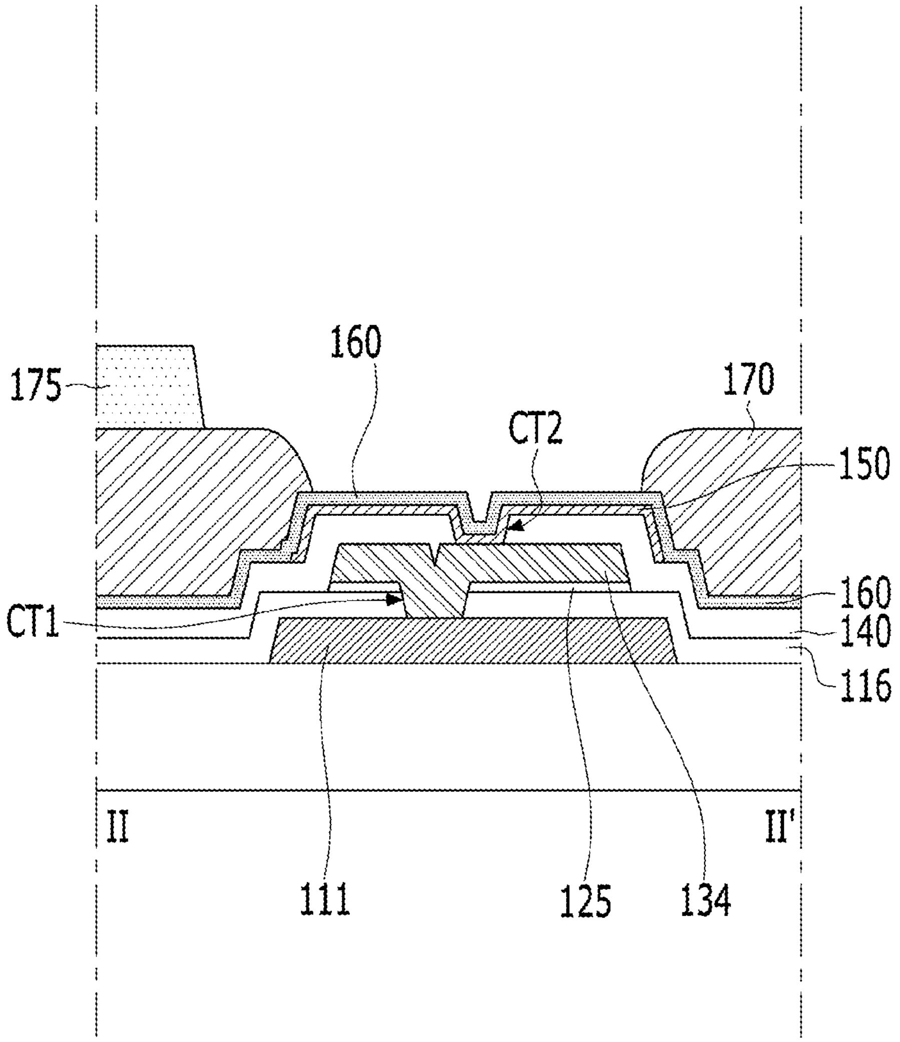
FIG. 5A is a cross-sectional view taken along line II to II' of FIG. 3.
Figure 5B:
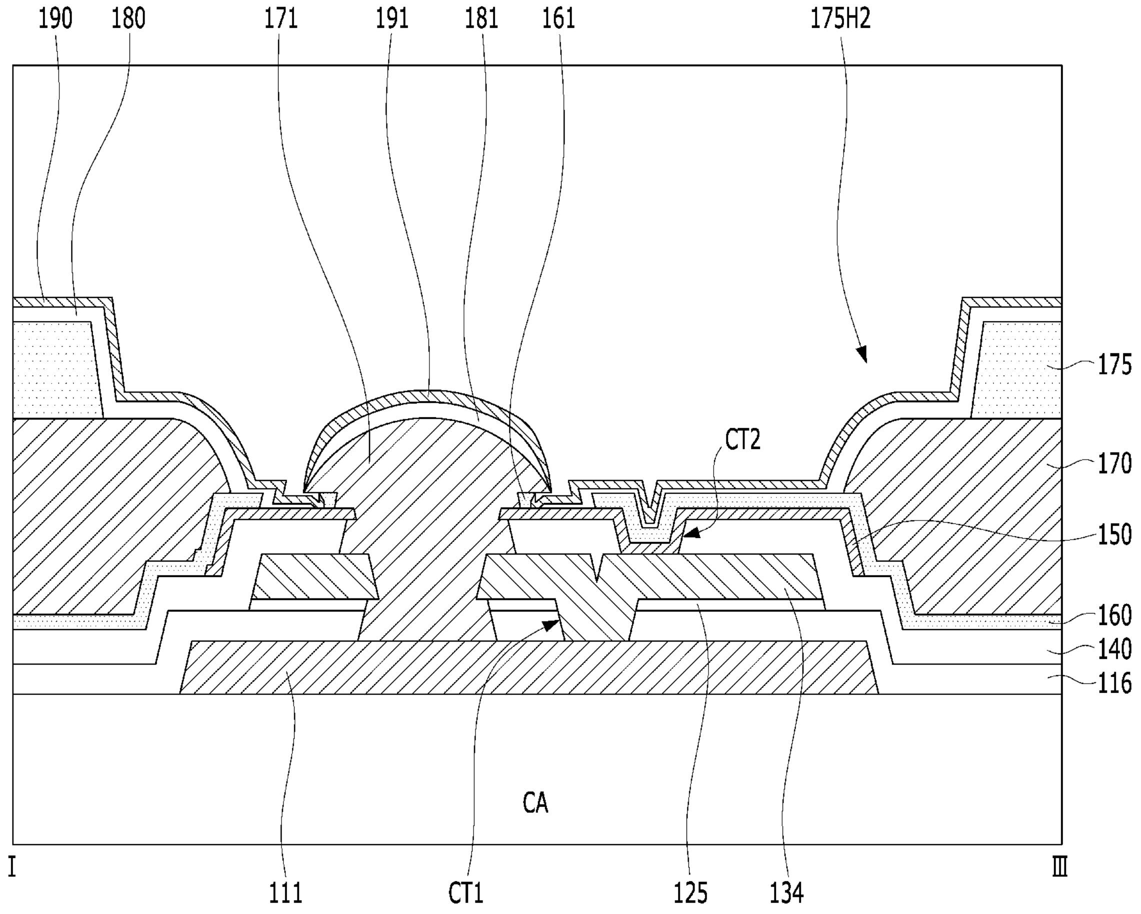
FIG. 5B is a cross-section view taken along line I~III of FIG. 3.

FIG. 3 is a plan view illustrating first and second bank holes adjacent to each other in the active area of FIG. 2 and an internal configuration thereof. FIG. 4 is a cross-sectional view taken along the line I-I' of FIG. 3. FIG. 5A is a cross-sectional view taken along line II to II' of FIG. 3. FIG. 5B is a cross-section view taken along line I~III of FIG. 3.

As shown in FIGS. 3 to 5B, the light-emitting display device according to an exemplary embodiment of the disclosure includes a buffer layer 116 having a first hole 116H on the auxiliary wire 111, a gate metal layer 134 (also denoted as a first metal layer 134 in the present disclosure) having a second hole 134H overlapping the first hole 116H on the buffer layer 116, an interlayer insulating film 140 (also denoted as a second insulating layer 140 in the present disclosure) having a third hole 140H overlapping the second hole 134H on the gate metal layer 134, and a clad metal 150 (also denoted as a second metal layer 150 in the present disclosure) having a fourth hole 150H overlapping the third hole 140H on the interlayer insulating film 140.

In addition, the light-emitting display device may further include an organic insulating film pattern 171 that fills the first to fourth holes 116H, 134H, 140H, and 150H, and contacts the auxiliary wire 111.

Here, the light-emitting display device may further include a gate insulating layer 125 under the gate metal layer 134. The gate insulating layer 125 is formed of an identical or similar material to the buffer layer 116 and thus has the same etching characteristics and has the same inclined surface. The hole of the gate insulating layer 125 is considered to be the same as that of the buffer layer 116.

In the light-emitting display device of the disclosure, as shown in FIG. 4, the organic insulating film pattern 171 having the bottom that contacts the auxiliary wire 111 is embedded in the stack structure of the inorganic films 116, 125, 134, 140, and 150, at the level corresponding to the thickness of the first to fourth holes 116H, 134H, 140H, and 150H, and thus has a surface contacting the side surfaces of the inorganic films 116, 125, 134, 140, and 150, and thereby improves the strength of bonding through physical fastening. In other words, the organic insulating film layer 171 may fill the first to fourth holes. Therefore, the organic insulating film pattern 171 is not detached and thus has no risk of acting as a large foreign material, and stabilizes the cathode connection to the auxiliary wire 111, even when physical stimulus such as washing is applied thereto after formation processes.

For example, the overhang structure formed with an overcoat layer pattern provided on the interlayer insulating film may be detached when physical stimulus such as cleaning is applied after formation processes and the detached organic island-like structure may act as large foreign matter in the device. However, the light-emitting display device of the disclosure solves this problem.

In addition, in the light-emitting display device of the disclosure, the first side surface S1 of the buffer insulating layer surrounding the first hole 116H, the second side surface S2 of the gate metal layer 134 surrounding the second hole 134H, the third side surface S3 of the interlayer insulating film 140 surrounding the third hole 140H, and the fourth side surface S4 of the clad metal 150 surrounding the fourth hole 150H have different tapers adjacent to each other in a vertical direction. That is, the organic insulating film pattern 171 contacts the embossed surface of the first to fourth side surfaces S1 to S4 having different tapers adjacent to each other, and has a plurality of bonding surfaces and thus has strong adhesive strength and physical robustness to the inorganic films 116, 125, 134, 140, and 150.

Here, the second side surface S2 and the fourth side surface S4 of the gate metal layer 134 and the clad metal 150, each formed of a metal component, are similar to each other and the first side surface S1 and the third side surface S3 of the buffer layer 116 and the interlayer insulating film 140, each formed of an inorganic insulating component, may be similar to each other. In other words, the first and third side surfaces S1 and S3 may have, for example, a reverse taper, and the second and fourth side surfaces S2 and S4 may have a regular taper.

In addition, the second side surface S2 protrudes from the first side surface S1 and the third side surface S3 vertically adjacent from the bottom and top, and the fourth side surface S4 protrudes from the third side surface S3 adjacent to the lower side of S4, to extend an adhesion area between the organic insulating film pattern 171 and the side surface and thereby improve adhesion therebetween.

Meanwhile, as shown in FIGS. 3 and 5B, the auxiliary wire 111 and the gate metal layer 134 may be connected to each other through a first contact hole CT1 provided in the buffer layer 116 in the area where they do not overlap with the first to fourth holes 116H, 134H, 140H, and 150H. In addition, the gate metal layer 134 and the clad metal 150 may be connected to each other through the second contact hole CT2 provided in the interlayer insulating film (it may be denoted as a second insulating layer in this specification) 140. Therefore, a triple connection is provided between the auxiliary wire 111, the gate metal layer 134, and the clad metal 150, and the top surface of the clad metal 150 is connected to the cathode 190 embedded in the overhang structure of the organic insulating film pattern 171, as shown in FIGS. 5A and 5B. As a result, an electrical connection based on the quadruple connection of the auxiliary wire 111, the gate metal layer 134, the clad metal 150 and the cathode 190 is formed.

Since the intermediate layer 180 is deposited straight, it has a wide coverage and thus is not deposited in the area where the organic insulating film pattern 171 partially overlaps the clad metal 150. The cathode 190, which has relatively excellent step coverage characteristics, passes through the edge of the intermediate layer 180, enters the lower side of the overhang structure of the organic insulating film pattern 171 overlapping the clad metal 150, and is connected to the clad metal 150.

Meanwhile, the vertical height of the overhang structure in the embodiments according to FIGS. 2 to 5B may be determined by the thickness of the adjacent inorganic protective layer 160. FIG. 4 shows a configuration in which, when an inorganic protective layer dummy pattern 161 (also denoted as an inorganic protective layer dummy 161 in the present disclosure) is also formed, the inorganic protective layer 160 having a higher selective etching rate is etched more than the edge on the lower side of the organic insulating film pattern 171 overlapping with the clad metal 150, and a partial width of the inorganic protective layer dummy pattern 161 is left and supports the overhang structure. Under the overhang structure, the inorganic protective layer dummy pattern 161 may be left inside than a lower end of the overhang structure. The inorganic protective layer dummy pattern 161 may be identical material as the inorganic protective layer 160.

Hereinafter, a method of forming the organic insulating film pattern 171 according to the disclosure will be described with reference to process drawings.

FIGS. 6A to 6F are process cross-sectional views taken along line I-I' in FIG. 3.

Figure 6A:
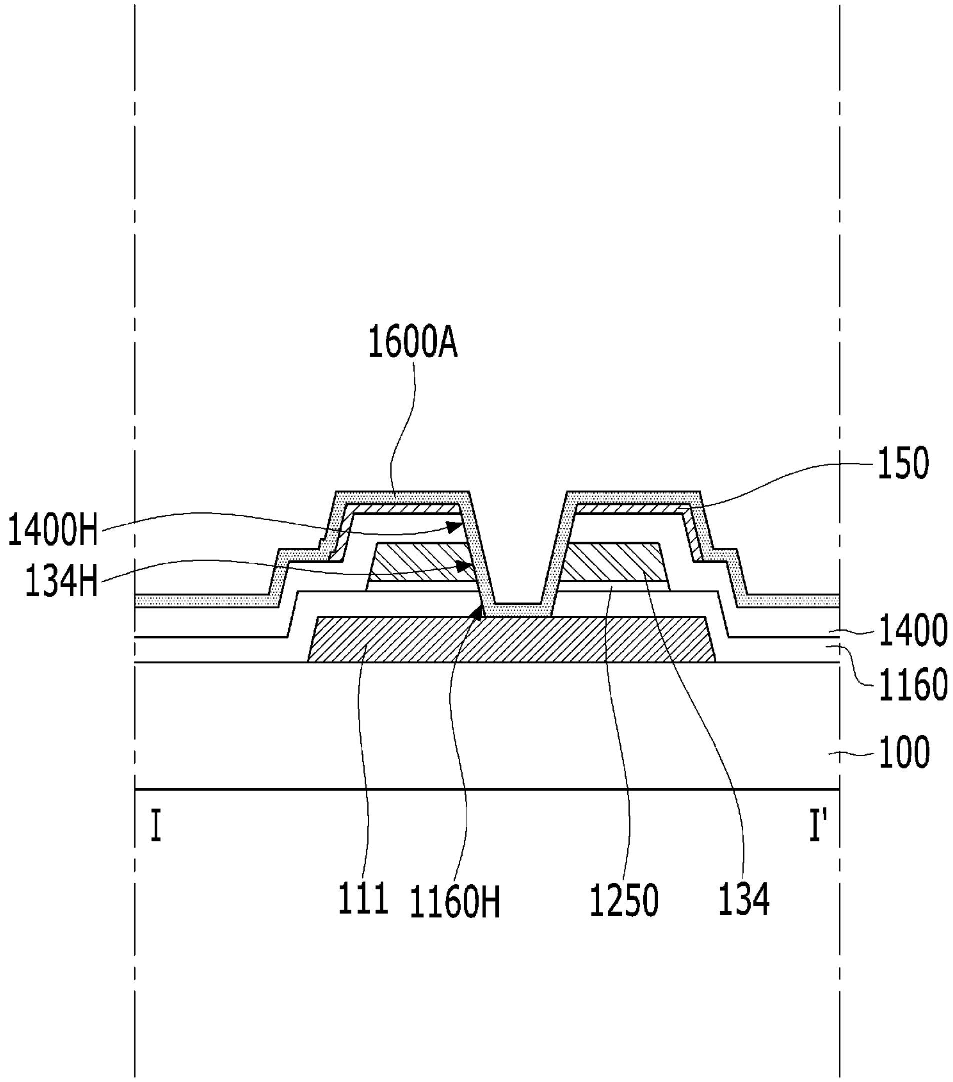
FIGS. 6A to 6F are process cross-sectional views taken along the line I-I' in FIG. 4.

As shown in FIG. 6A, first, an auxiliary wire 111 is formed on a substrate 100.

Then, a buffer layer material 1160 covering the auxiliary wire 111 is formed.

Then, a gate insulating layer material 1250 is formed, and a portion of the buffer layer material 1160 is removed along with the gate insulating layer material 1250 to form a buffer layer hole 1160H exposing a portion of the auxiliary wire 111.

Then, a gate metal material is formed and then patterned to form a second hole 134H overlapping the buffer layer hole 1160H.

Then, the interlayer insulating film material 1400 is formed and then patterned to form an interlayer insulating film hole 1400H overlapping the second hole 134H.

Then, the clad metal material is patterned to form a clad metal 150 having the fourth hole 150H.

Then, an inorganic protective layer material 1600A is formed over the entire surface such that it extends to the top of the auxiliary wire 111 through each hole.

Figure 6B:
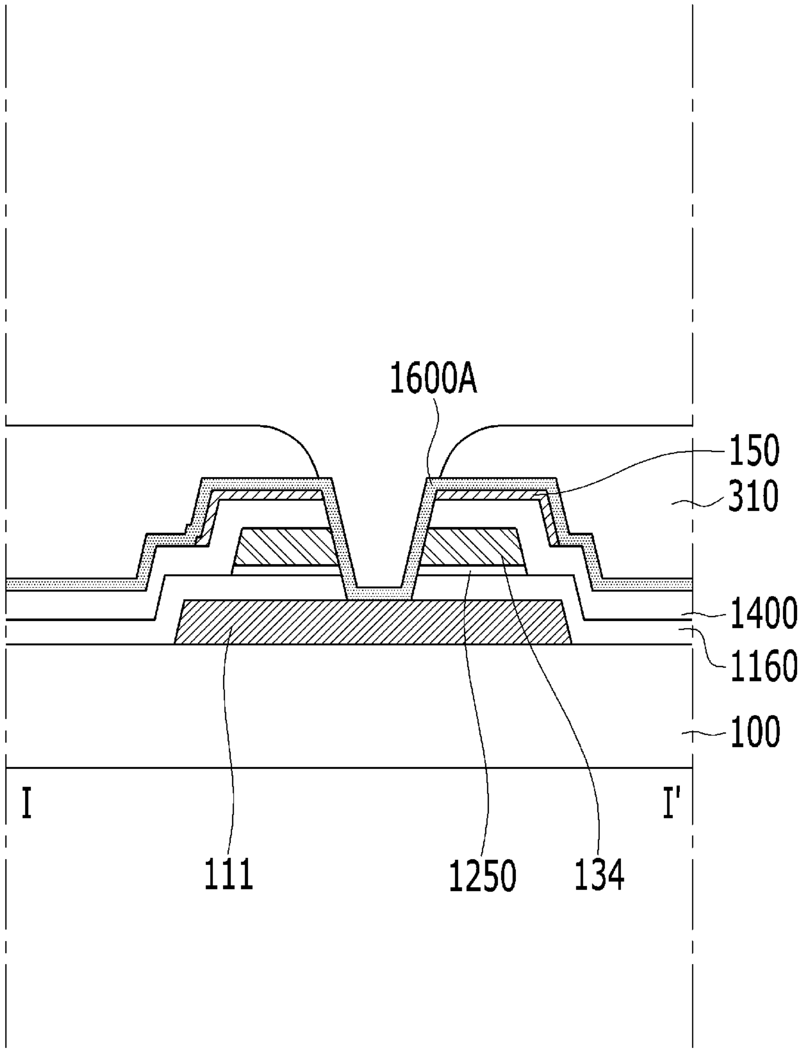

Then, as shown in FIG. 6B, a first photoresist film 310 is formed on the inclined surface of the clad metal 150 and the gate metal layer 134 so that the inner inorganic protective layer material 1600A is exposed.

Figure 6C:
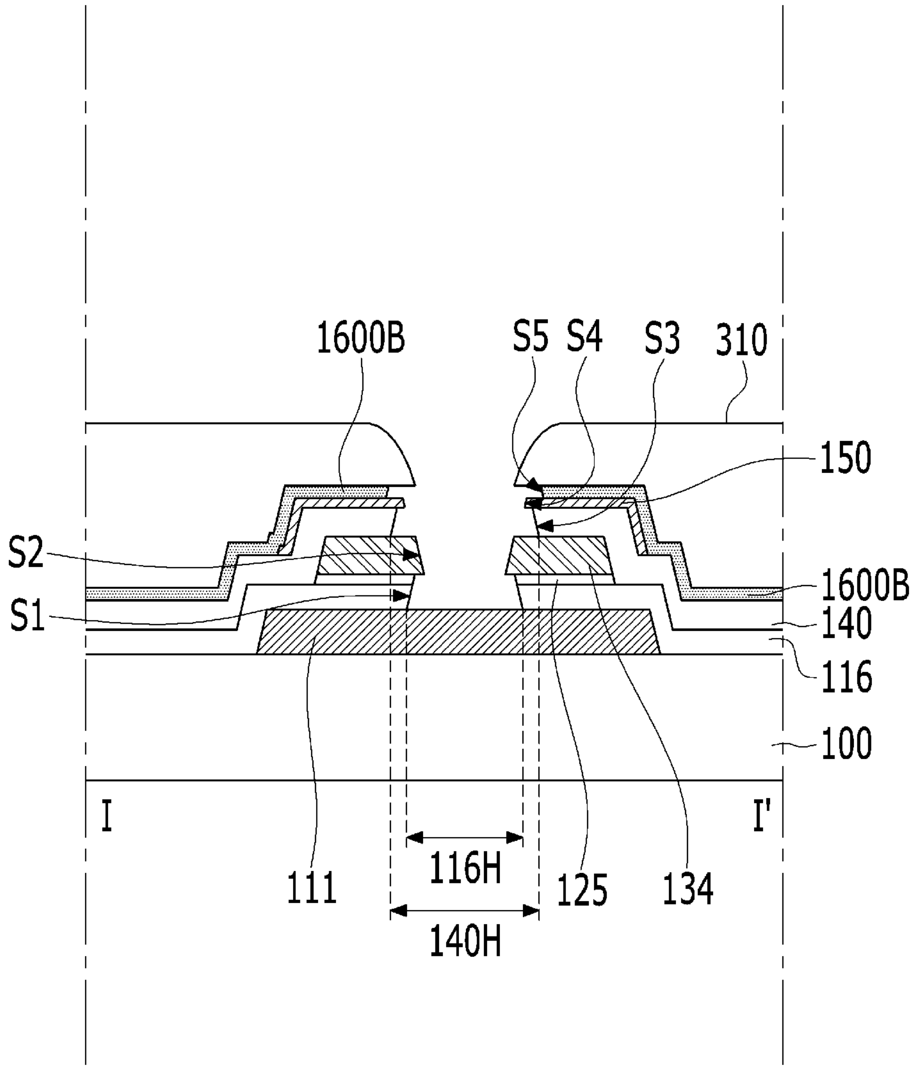

The inorganic protective layer material 1600A and the interlayer insulating film material 1400 are wet-etched so as to be depressed compared to the clad metal 150 and the gate metal layer 134 using the first photoresist film 310 as a mask and using an etchant having a higher etching selectivity to an inorganic film than a metal, to form an inorganic protective layer pattern 1600B having a larger hole than the clad metal 150, a buffer layer 116 having a first hole 116H, and an interlayer insulating film 140 having a third hole 140H, as shown in FIG. 6C.

Then, the first photoresist film 310 is removed by stripping.

Here, a fifth side surface S5 of the inorganic protective layer pattern 1600B is formed, along with a first side surface S1 of the buffer layer 116 on the auxiliary wiring 111, a second side surface S2 of the gate metal layer 134, a third side surface S3 of the interlayer insulating film 140, and a fourth side surface S4 of the clad metal 150.

The fifth side surface S5 of the inorganic protective layer pattern 1600B of the inorganic insulating film material, the third side surface S3 of the interlayer insulating film 140 and the first side surface S1 of the buffer layer 116 have a negative taper (an inverse taper), whereas the second side surface S2 formed of the gate metal layer 134 and the fourth side surface S4 of the clad metal 150 have a positive taper.

Figure 6D:
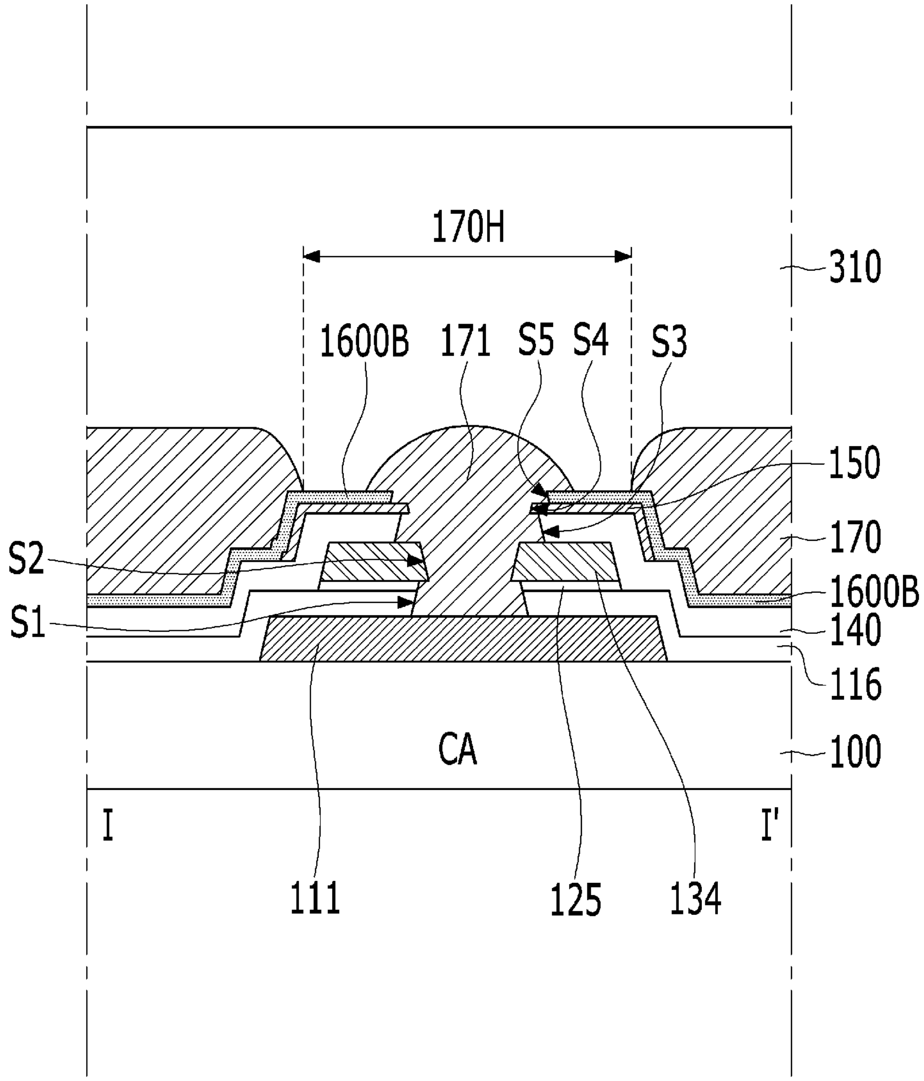
Figure 6E:
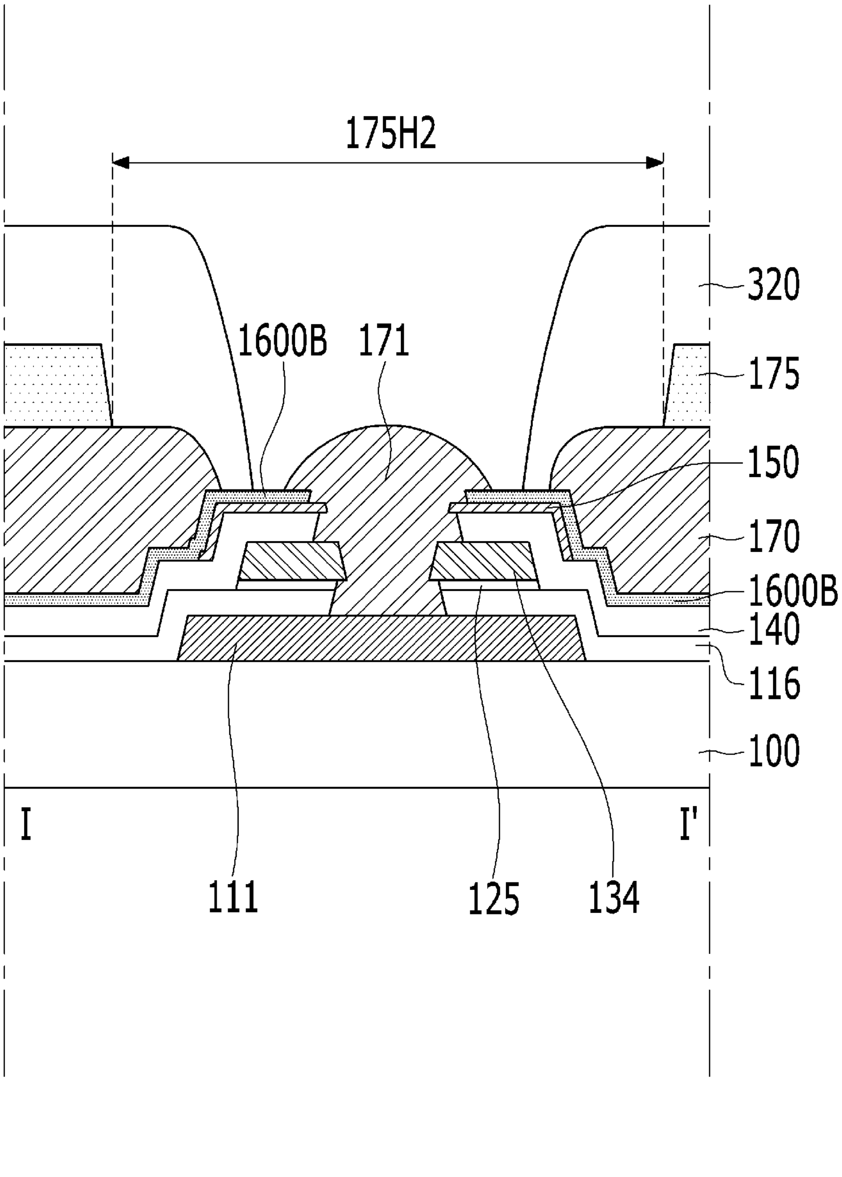

Then, as shown in FIG. 6D, a planarization film-forming material is applied and then selectively removed to form a planarization film 170 having a planarization film hole 170H on the auxiliary wire 111, and an organic insulating film pattern 171 is formed so as to be disposed in the planarization film hole 170H, to cover the edge of the inorganic protective layer pattern 1600B and to overlap a portion of the width of the inorganic protective layer pattern 1600B.

Here, the side surface of the organic insulating film pattern 171 contacts the first to fifth side surfaces S1, S2, S3, S4, and S5 of the buffer layer 116, the gate metal layer 134, the interlayer insulating film 140, the clad metal 150, and the inorganic protective layer pattern 1600B and the side surface of the gate insulating layer 125, and the bottom surface of the organic insulating film pattern 171 contacts the auxiliary wire 111, so that three-dimensional adhesive strength is structurally imparted to the bottom and side surfaces thereof.

Then, a bank 175 having a second bank hole 175H2 is formed corresponding to the auxiliary wire 111.

Figure 6F:
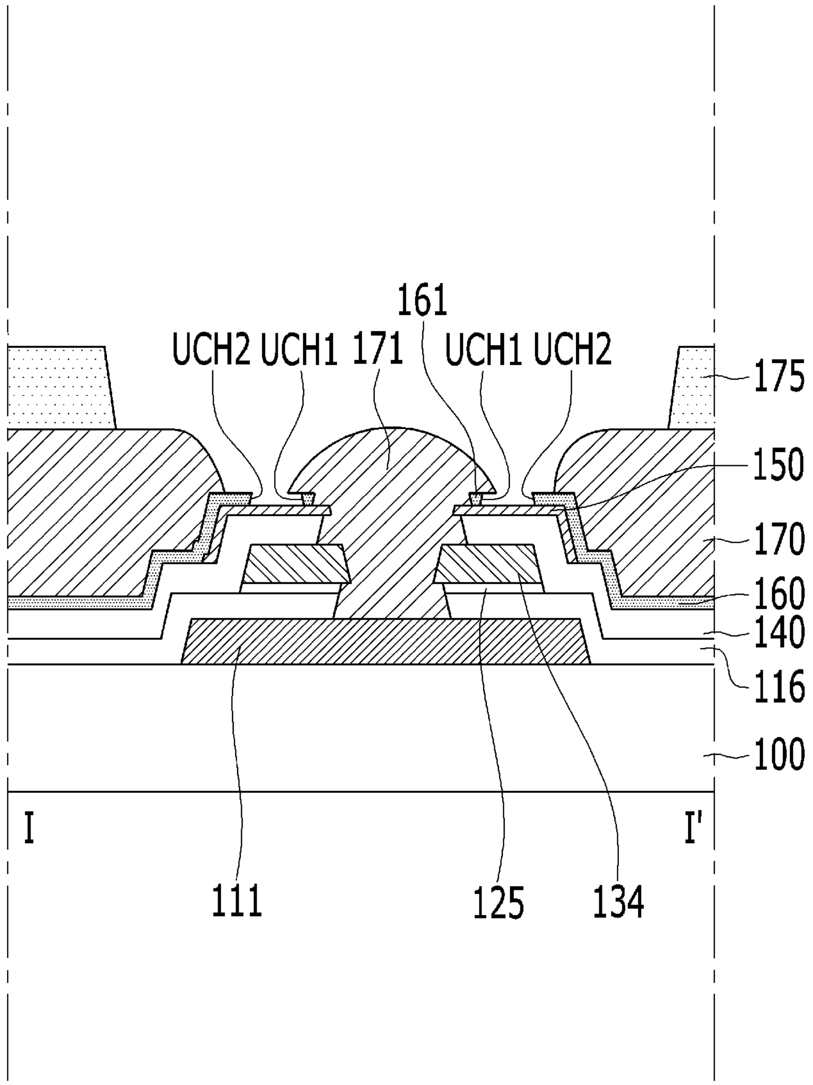

Then, a second photoresist layer 1600H having an exposed area smaller than the planarization film hole 170H and partially exposing the organic insulating film pattern 171 and the inorganic protective layer pattern 1600B adjacent thereto is formed and then is used as a mask to remove the second photoresist layer 1600H by undercutting. Through this process, as shown in FIG. 6F, an inorganic protective layer dummy pattern 161 having a first undercut UCH1 that is removed inward from the upper surface of the organic insulating film pattern 171 having an overhang shape, and an inorganic protective layer 160 (also known as the inorganic passivation layer) that is spaced apart from the inorganic protective layer dummy 161 has a second undercut UCH2 and protrudes further than the planarization film 170.

The second photoresist layer 320 is removed after forming the inorganic protective layer 160 and the inorganic protective layer dummy pattern 161.

Here, the inorganic protective layer dummy pattern 161 supports the organic insulating film pattern 171 of the overhang structure, and is adjacent to the first undercut UCH1 so that the cathode 190 is connected to the clad metal 150 in a subsequent process to form an electrical connection.

Figure 7:
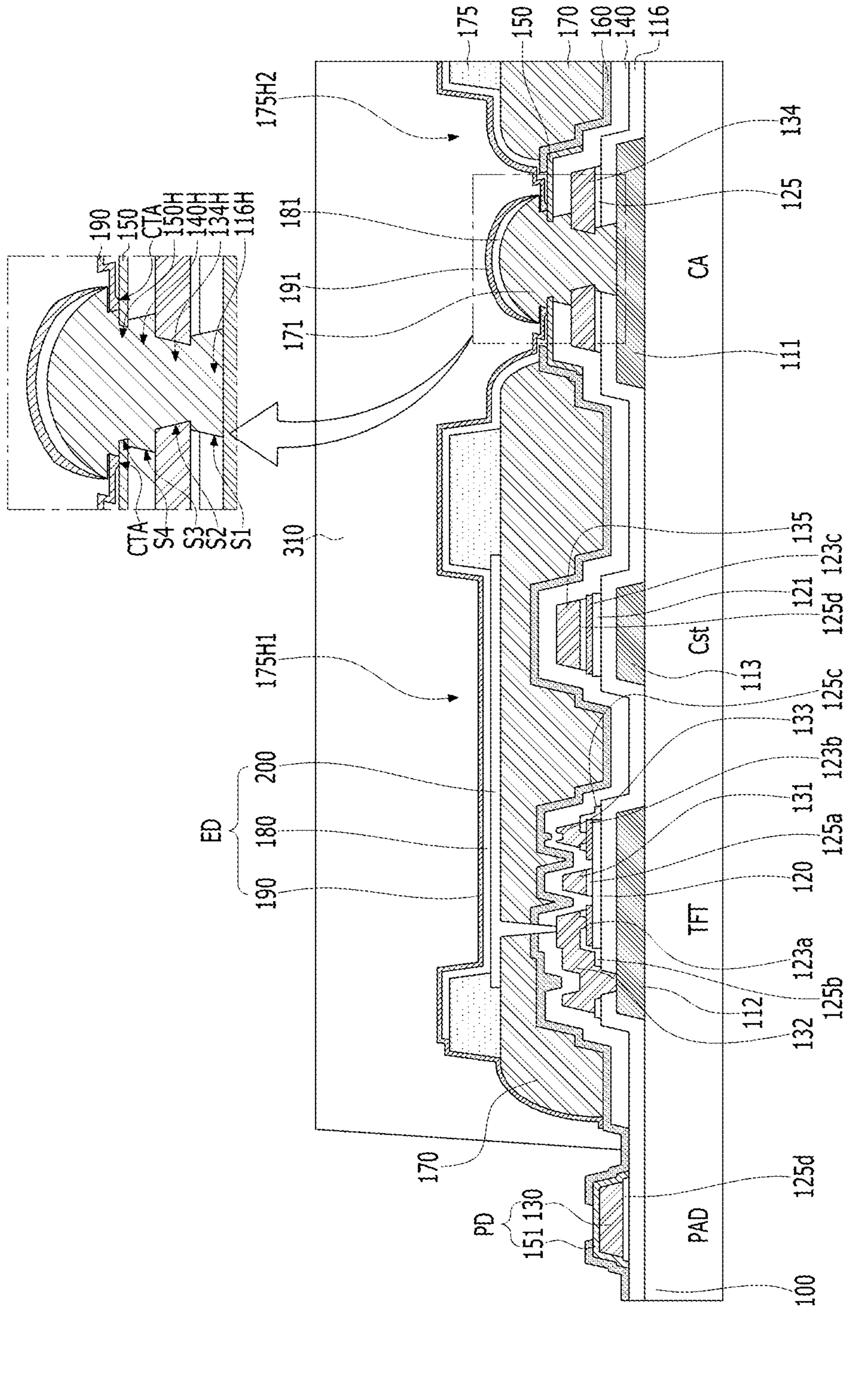
FIG. 7 is a cross-sectional view illustrating a light-emitting display device according to a second exemplary embodiment of the disclosure.

FIG. 7 is a cross-sectional view illustrating a light-emitting display device according to a second exemplary embodiment of the disclosure.

As shown in FIG. 7, the light-emitting display device according to the second embodiment of the disclosure has a configuration in which the inorganic protective layer dummy 161 under the overhang structure of the organic insulating film pattern 171 is entirely removed by an etching process described in FIG. 6F. In this case, the cathode 190 may be connected to the clad metal 150 under the overhang structure such that it contacts the side surface of the organic insulating film pattern 171. This provides more contact area between the cathode and the side surface of the organic insulating film pattern 171.

Figure 8:
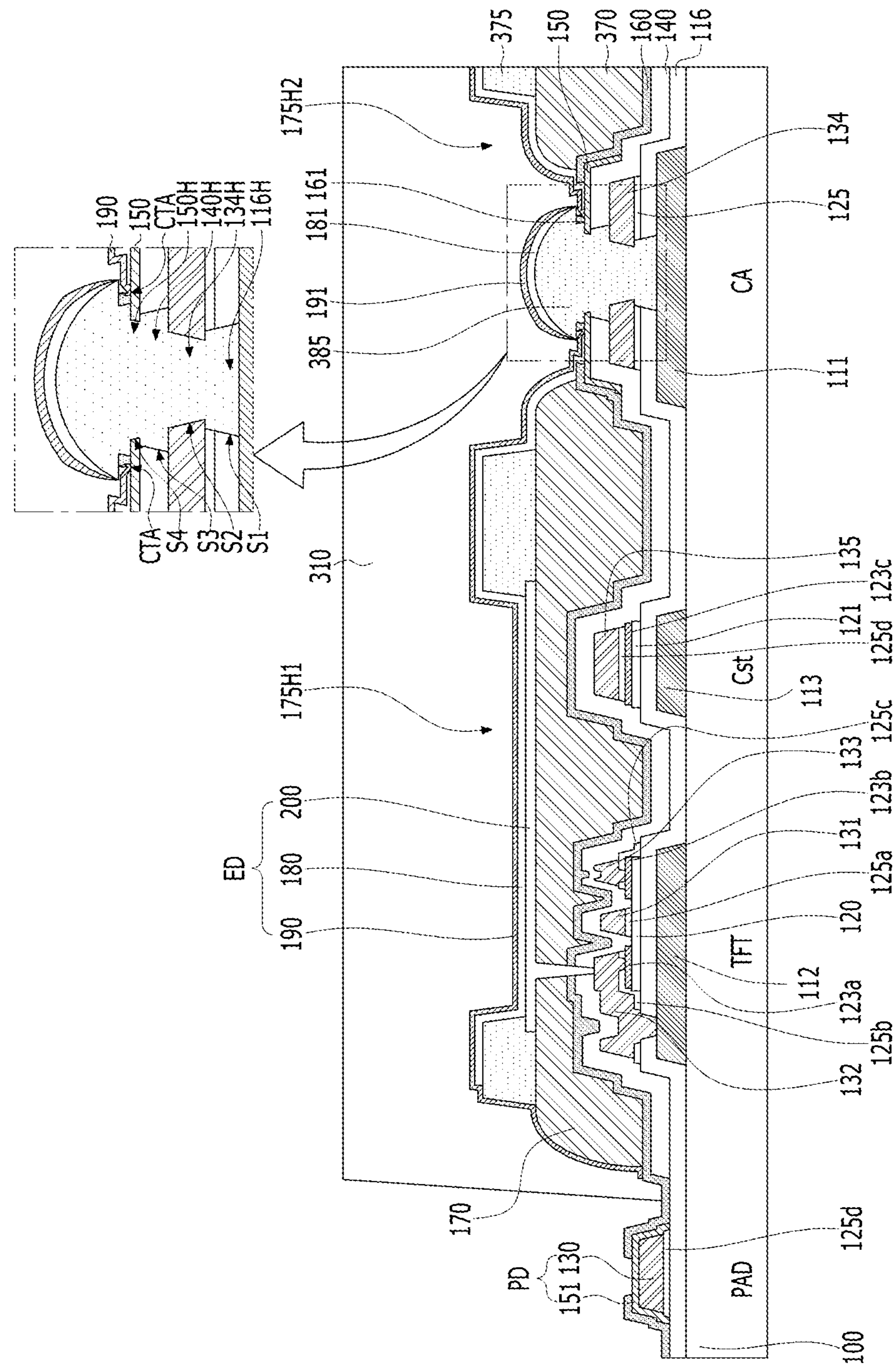
FIG. 8 is a cross-sectional view illustrating a light-emitting display device according to a third exemplary embodiment of the disclosure.

FIG. 8 is a cross-sectional view illustrating a light-emitting display device according to a third exemplary embodiment of the disclosure.

As shown in FIG. 8, the light-emitting display device according to the third exemplary embodiment of the disclosure has a configuration in which the organic insulating film pattern 385 contacting the auxiliary wire 111 is formed of the same material as the bank 375. This can make the manufacturing process more simple.

Even in this case, the cathode 190 is connected to the clad metal 150 below the overhang structure of the organic insulating film pattern 171, and as shown in FIG. 5, through the triple connection between the auxiliary wire 111, the gate metal layer 134, and the clad metal 150, an electrical connection between the cathode 190 and the auxiliary wire 111 is created.

In the light-emitting display device of the disclosure, an organic insulating film pattern as an island structure forming an overhang structure is formed to be in contact with an auxiliary wire, so that multiple bonding surfaces are formed on the bottom and side surfaces of the organic insulating film pattern and thus the detachment of the island structure can be prevented.

A light-emitting display device according to one or more aspects of the present disclosure may comprise an auxiliary wire on a substrate, a first insulating layer having a first hole on the auxiliary wire, a first metal layer having a second hole overlapping the first hole on the first insulating layer, a second insulating layer having a third hole overlapping the second hole on the first metal layer, a second metal layer having a fourth hole overlapping the third hole on the second insulating layer and an organic insulating film pattern filling the first hole to the fourth hole and contacting the auxiliary wire.

In a light emitting display device according to one or more aspects of the present disclosure, a first side surface of the first insulating layer surrounding the first hole, a second side surface of the first metal layer surrounding the second hole, a third side surface of the second insulating layer surrounding the third hole, and the fourth side surface of the second metal layer surrounding the fourth hole may have different tapers adjacent to each other in a vertical direction.

In a light emitting display device according to one or more aspects of the present disclosure, the first and third side surfaces may have reverse tapers.

In a light emitting display device according to one or more aspects of the present disclosure, the second side surface may protrude from the first side surface and the third side surface. In a light emitting display device according to one or more aspects of the present disclosure, the fourth side surface may protrude from the third side surface.

In a light emitting display device according to one or more aspects of the present disclosure, at a position where the first to fourth holes do not overlap, the auxiliary wire may be connected to the first metal layer through a first contact hole provided in the first insulating layer. The first metal layer may be connected to the second metal layer through a second contact hole provided in the second insulating layer.

A light emitting display device according to one or more aspects of the present disclosure may further comprise a planarization film spaced apart from the organic insulating film pattern around the auxiliary wire. A light emitting display device according to one or more aspects of the present disclosure may further comprise a light-emitting element. The light-emitting element may comprise a first electrode, an intermediate layer, and a second electrode stacked on the planarization film. A light emitting display device according to one or more aspects of the present disclosure may further comprise a thin film transistor disposed under the planarization film.

In a light emitting display device according to one or more aspects of the present disclosure, the organic insulating film pattern and the planarization film may comprise a same material or may be formed of the same material. Or the organic insulating film pattern and the planarization film may be identical material.

In a light emitting display device according to one or more aspects of the present disclosure, the organic insulating film pattern comprises a same material or may be formed of the same material as a bank defining a light-emitting portion of the first electrode.

In a light emitting display device according to one or more aspects of the present disclosure, the organic insulating film pattern at an upper part includes an overhang structure overlaps the second metal layer above an upper part of the second metal layer and the overhang structure is vertically spaced apart from the upper surface of the second metal layer by a predetermined distance. A vertical distance between the overhang structure and the upper surface of the second metal layer may be predetermined by the thickness of inorganic protective layer dummy pattern 161. The inorganic protective layer dummy pattern 161 may be identical material as the inorganic protective layer 160.

In a light emitting display device according to one or more aspects of the present disclosure, the second electrode may be connected to the upper surface of the second metal layer at a lower part of the overhang structure.

A light emitting display device according to one or more aspects of the present disclosure may further comprise an inorganic protective layer between the second insulating layer and the planarization film.

In a light emitting display device according to one or more aspects of the present disclosure, the second insulating layer and the inorganic protective layer may sequentially cover the thin film transistor. The inorganic protective layer may be closer to the organic insulating film pattern than the planarization film, and the organic insulating film pattern may be vertically spaced from the upper surface of the second metal layer by a distance corresponding to a thickness of the inorganic protective layer.

In a light emitting display device according to one or more aspects of the present disclosure, an inorganic protective layer dummy pattern may be spaced apart from the inorganic protective layer and comprises a same material as the inorganic protective layer. The inorganic protective layer dummy pattern may have one side surface contacting the organic insulating film pattern and supports a portion of the overhang structure.

In a light emitting display device according to one or more aspects of the present disclosure, the inorganic protective layer may cover an outer edge of the second metal layer and exposes an upper surface of the second metal layer.

In a light emitting display device according to one or more aspects of the present disclosure, the first metal layer may be at a same layer as at least one metal constituting the thin film transistor.

In a light emitting display device according to one or more aspects of the present disclosure, the second metal layer may be a same layer as a pad protection electrode protecting a pad portion.

In a light emitting display device according to one or more aspects of the present disclosure, the second electrode may be connected to the second metal layer under the overhang structure and contacts a side surface of the inorganic protective layer dummy pattern.

As apparent from the foregoing, in the light-emitting display device of the disclosure, an organic insulating film pattern as an island structure forming an overhang structure is formed to be in contact with an auxiliary wire, so that multiple bonding surfaces are formed on the bottom and side surfaces of the organic insulating film pattern and thus detachment of the island structure can be prevented.

In the overhang structure formed by the organic insulating film pattern, the cathode is connected to the clad metal and a contact hole between the auxiliary wire and the clad metal is provided in an area that does not overlap with the organic insulating film pattern to form an electrical connection path to the metal to thereby create an electrical connection between the cathode and the auxiliary wire. Therefore, by connecting the auxiliary wire to the cathode serving as a common electrode in the active area, it is possible to apply a uniform voltage to the cathode over the entire active area and to prevent luminance non-uniformity.

The light-emitting display device of the disclosure uses, as bonding surfaces, portions where multiple tapers are generated due to the difference in etching selectivity between the metal layer and the insulating layers at the side of the hole through which the organic insulating film pattern passes to the auxiliary wire. Therefore, the organic insulating film pattern is structurally engaged with the multi-tapered side surface to prevent the organic insulating film pattern from being separated from the hole, thereby effectively preventing generation of large foreign matter due to detachment of the island-type structure.

In addition, the light-emitting display device of the disclosure can reinforce the stability of the organic insulating film pattern constituting the overhang structure, thereby preventing generation of harmful substances such as large foreign matter in the light-emitting device and preventing defects caused thereby. Accordingly, the light-emitting display device has an ESG (environmental/social/governance) effect in terms of eco-friendliness, low power consumption, and process optimization.

It will be apparent to those skilled in the art that various modifications and variations can be made in the disclosure without departing from the scope of the disclosure. Thus, it is intended that the disclosure covers such modifications and variations thereof, provided they fall within the scope of the appended claims and their equivalents.

What is claimed is:

1. A light-emitting display device comprising:

an auxiliary wire on a substrate;

a first insulating layer having a first hole on the auxiliary wire;

a first metal layer having a second hole overlapping the first hole on the first insulating layer;

a second insulating layer having a third hole overlapping the second hole on the first metal layer;

a second metal layer having a fourth hole overlapping the third hole on the second insulating layer;

an organic insulating film pattern filling the first hole to the fourth hole and contacting the auxiliary wire, a planarization film spaced apart from the organic insulating film pattern around the auxiliary wire;

a light-emitting element comprising a first electrode, an intermediate layer, and a second electrode stacked on the planarization film; and a thin film transistor disposed under the planarization film.

2. The light-emitting display device according to claim 1, wherein a first side surface of the first insulating layer surrounding the first hole, a second side surface of the first metal layer surrounding the second hole, a third side surface of the second insulating layer surrounding the third hole, and a fourth side surface of the second metal layer surrounding the fourth hole have different tapers adjacent to each other in a vertical direction.

3. The light-emitting display device according to claim 2, wherein the first and third side surfaces have reverse tapers.

4. The light-emitting display device according to claim 2, wherein the second side surface protrudes from the first side surface and the third side surface, and the fourth side surface protrudes from the third side surface.

5. The light-emitting display device according to claim 1, wherein: at a position where the first to fourth holes do not overlap, the auxiliary wire is connected to the first metal layer through a first contact hole provided in the first insulating layer, and the first metal layer is connected to the second metal layer through a second contact hole provided in the second insulating layer.

6. The light-emitting display device according to claim 1, wherein the organic insulating film pattern and the planarization film comprise a same material.

7. The light-emitting display device according to claim 1, wherein the organic insulating film pattern comprises a same material as a bank defining a light-emitting portion of the first electrode.

8. The light-emitting display device according to claim 1, wherein the organic insulating film pattern at an upper part includes an overhang structure that overlaps the second metal layer above an upper surface of the second metal layer, and the overhang structure is vertically spaced apart from the upper surface of the second metal layer by a predetermined distance, and the second electrode is connected to the upper surface of the second metal layer at a lower part of the overhang structure.

9. The light-emitting display device according to claim 8, further comprising:

an inorganic protective layer between the second insulating layer and the planarization film, wherein the second insulating layer and the inorganic protective layer sequentially cover the thin film transistor, and the inorganic protective layer is closer to the organic insulating film pattern than the planarization film, and the organic insulating film pattern is vertically spaced from the upper surface of the second metal layer by a distance corresponding to a thickness of the inorganic protective layer.

10. The light-emitting display device according to claim 9, further comprising:

an inorganic protective layer dummy pattern that is spaced apart from the inorganic protective layer and comprises a same material as the inorganic protective layer, wherein the inorganic protective layer dummy pattern has one side surface contacting the organic insulating film pattern and supports a portion of the overhang structure.

11. The light-emitting display device according to claim 8, wherein the inorganic protective layer covers an outer edge of the second metal layer and exposes an upper surface of the second metal layer.

12. The light-emitting display device according to claim 1, wherein the first metal layer is on a same layer as at least one metal constituting the thin film transistor.

13. The light-emitting display device according to claim 1, wherein the second metal layer is on a same layer as a pad protection electrode protecting a pad portion.

14. The light-emitting display device according to claim 10, wherein the second electrode is connected to the second metal layer under the overhang structure and contacts a side surface of the inorganic protective layer dummy pattern.

* * * * *